United States Patent [19]

Irlbeck et al.

[11] Patent Number: 5,588,846

[45] Date of Patent: Dec. 31, 1996

[54] RIGHT ANGLE ELECTRICAL CONNECTOR

[75] Inventors: Robert D. Irlbeck, Greensboro; Warren A. Bates, Winston-Salem, both of N.C.; Robert Dumas, North Palm Beach, Fla.; Keith L. Volz, Jamestown, N.C.

[73] Assignee: The Whitaker Corporation, Wilmington, Del.

[21] Appl. No.: 519,208

[22] Filed: Aug. 25, 1995

[51] Int. Cl.$^6$ .................................................. H01R 9/9
[52] U.S. Cl. ................................................. 439/66; 439/65
[58] Field of Search ........................................ 439/66, 91

[56] References Cited

U.S. PATENT DOCUMENTS

| | | | |
|---|---|---|---|
| 3,858,958 | 1/1975 | Davies | 339/17 LM |
| 4,693,529 | 9/1987 | Stillie | 439/67 |
| 4,992,908 | 2/1991 | Solomon | 361/400 |
| 5,026,290 | 6/1991 | Dery | 439/65 |
| 5,118,300 | 1/1992 | Zarreii | 439/79 |
| 5,273,450 | 12/1993 | Renn et al. | 439/260 |
| 5,336,094 | 8/1994 | Johnson | 439/70 |
| 5,338,207 | 8/1994 | Lineberry et al. | 439/62 |
| 5,362,247 | 11/1994 | Rodriguez | 439/330 |
| 5,376,008 | 12/1994 | Rodriguez | 439/66 |

OTHER PUBLICATIONS

"A Unique, Solderless, Surface Mount Interconnection System", pp. 4 and 5, by Warren Bates, Fred Deak, Keith Volz; published 1992, AMP Incorporated, Harrisburg, PA 17105.

*Primary Examiner*—Neil Abrams
*Assistant Examiner*—Brian J. Biggi
*Attorney, Agent, or Firm*—Timothy J. Aberle

[57] ABSTRACT

A connector (10) including a PC board (12) which is fastened to a block (30) and presses against an elastomeric electrical component (40). Electrical device (20) includes a circuit trace (23) and printed circuit board (12) includes a circuit trace (13) which both engage a flexible film circuit (42) on the elastomeric electrical connector (40). Wedge member (50) engages a bottom edge (40b) of elastomeric electrical component (40) for biasingly engaging the component (40) and urging the component (40) and flexible circuit (42) towards and against circuit traces (13,23). Additionally, good electrical contact and compliance to planar irregularities are maintained between circuit traces (13,23) and flexible film circuit (42) thereby ensuring good electrical contact therebetween.

14 Claims, 3 Drawing Sheets

RIGHT ANGLE ELECTRICAL CONNECTOR

FIELD OF THE INVENTION

The present invention relates to an electrical connector for electrically interconnecting the circuits of electrical assemblies, for example, two printed circuit boards. More particularly, the present invention provides an electrical connector which incorporates a flexible electronic component for the purpose of reliably interconnecting the circuits of electrical assemblies disposed at a right angle relative to each other.

BACKGROUND OF THE INVENTION

Prior art FIG. 7 shows a right angle connector 80 including a flexible electronic component 86 disposed between a motherboard 84 and a daughterboard 82 having circuit traces 83 and 85, respectively. Connector 80 includes a connector housing 88 with a surface 89 for pressing flexible electronic component 86 against circuit trace 83 on daughterboard 82, and against circuit trace 85 of motherboard 84. Conventional connector 80 advantageously provides a means to interconnect the circuit traces of two printed circuit boards at a right angle. However, the conductive pad 83 must be located close to an edge of its respective board 82.

The present invention provides a right angle connector for use in interconnecting circuits on a first electrical assembly, e.g. a printed circuit board, with the circuit of a second electrical assembly, e.g. an active electrical device mounted on a second printed circuit board. The present invention advantageously: conserves space between the electrical assemblies to be joined; and eliminates the need to join the electrical assemblies at an edge of one assembly. Additionally, the present invention advantageously provides the biasing forces necessary to ensure that the circuit traces on the flexible electronic component of the present invention are maintained in engagement with the circuit traces on the printed circuit board and the electrical device.

SUMMARY OF THE INVENTION

The present invention provides an electrical connector for electrically interconnecting circuit traces on a printed circuit board and circuit traces on an electrical device, the electrical connector comprising: a resilient electrical component with a flexible film circuit wrapped around a center thereof for electrical interconnection with the circuit traces; a connector block member disposed adjacent to the electrical device; first and second walls formed on the electrical device and the block member, respectively, the walls defining a chamber for receipt of the resilient electrical component; and a biasing member located within the chamber for biasingly engaging the resilient electrical component. Wiping action between the flexible film circuit traces and the electrical device and the printed circuit board as the resilient electrical component is pressed into the chamber by the printed circuit board.

DETAILED DESCRIPTION OF THE INVENTION

Figure 1:
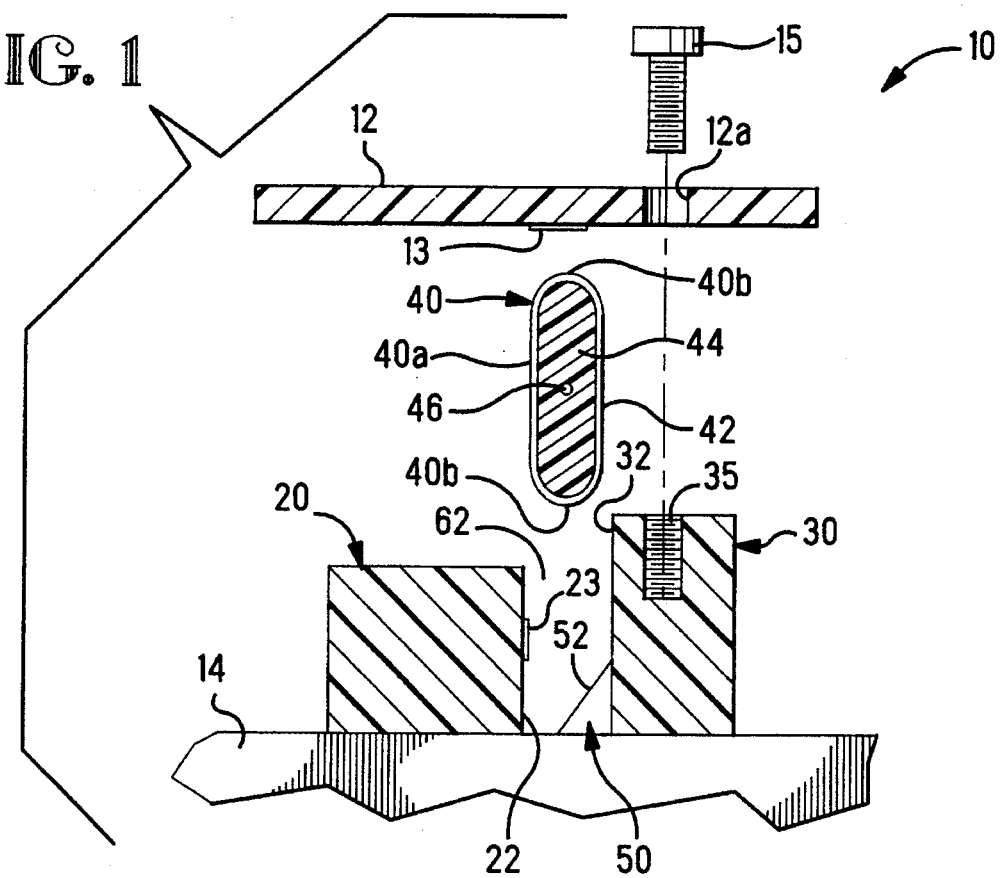
FIG. 1 shows an exploded view of the right angle electrical connector according to the present invention.

FIG. 1 shows the right angle electrical connector of the present invention in a pre-assembled state. Right angle electrical connector 10 includes PC board 12 having a circuit trace 13 thereon, a frame 14 with electrical device 20 and block 30 mounted thereon. Electrical device 20 is, for example, an active electrical device, e.g. a motor or a passive device. Fastener 15 is provided for insertion through aperture 12a of printed circuit board 12 so that fastener 15 can be threaded into threaded hole 35 of block 30. Elastomeric electrical component 40 includes a flexible circuit film 42 wrapped around an elastomeric core 44 having a center 46 (e.g. a fiberglass cord), a pair of straight sides 40a, and a pair of arcuate sides 40b. The oval cross section of component 40 is advantageous because it reduces the space needed to make the electrical interconnection as compared to a like component of a circular cross section. Line C of FIG. 2 denotes a line intersecting core center 46 and a radius center 47, which line is generally parallel to a longitudinal depth axis of chamber 62 when the printed circuit board 12 is not pressing on the electrical component 40. Elasto-meric electrical component 40 is shown in a pre-inserted position relative to a chamber 62 which is generally formed between electrical device 20 and block 30. Chamber 62 is defined by wall 22 of electrical device 20 and wall 32 of block 30, but with a wedge member 50 having a wedge wall 52 disposed in a bottom of chamber 62 for biasingly engaging an arcuate surface 40b of elastomeric electrical component 40. In particular, wedge wall 52 engages arcuate surface 40b of elastomeric electrical component 40.

Figure 2:
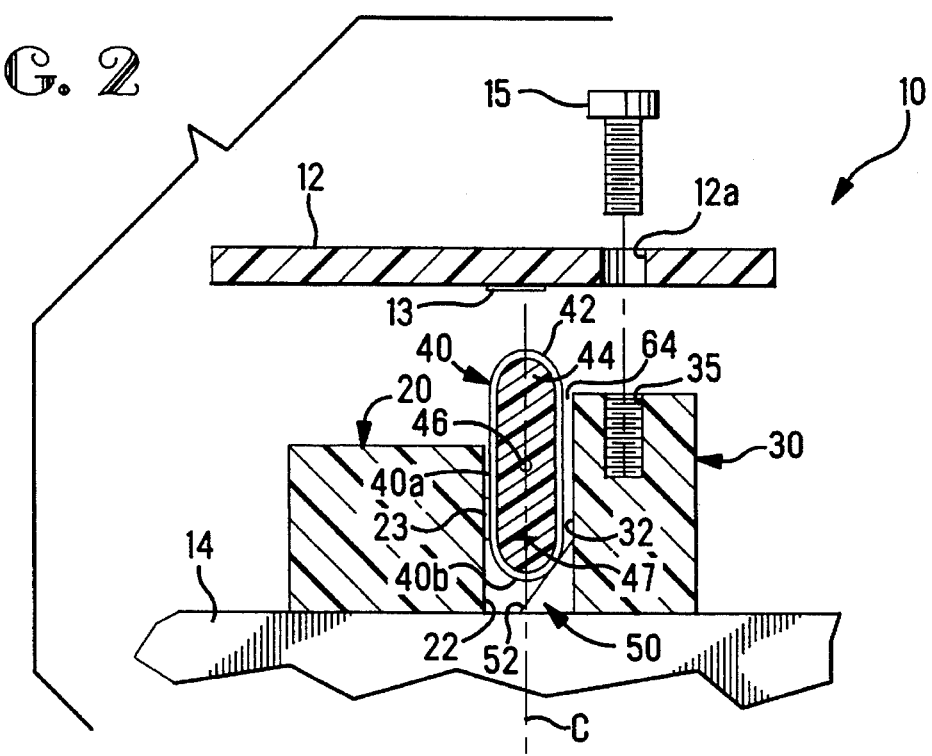
FIG. 2 shows the right angle connector of FIG. 1 in a partially assembled state, as the flexible electronic component has been inserted into the connector housing.

Referring to FIG. 2, it is seen that elastomeric electrical component 40 has been inserted into chamber 62 and is yet in a largely unstressed state. There is a gap 64 between elastomeric electrical component 40 and block 30, but arcuate surface 40b rests on wedge wall 52 of wedge 50, and circuit trace 23 of block 20 touches the flexible circuit 42 on elastomeric electrical component 40.

Figure 3:
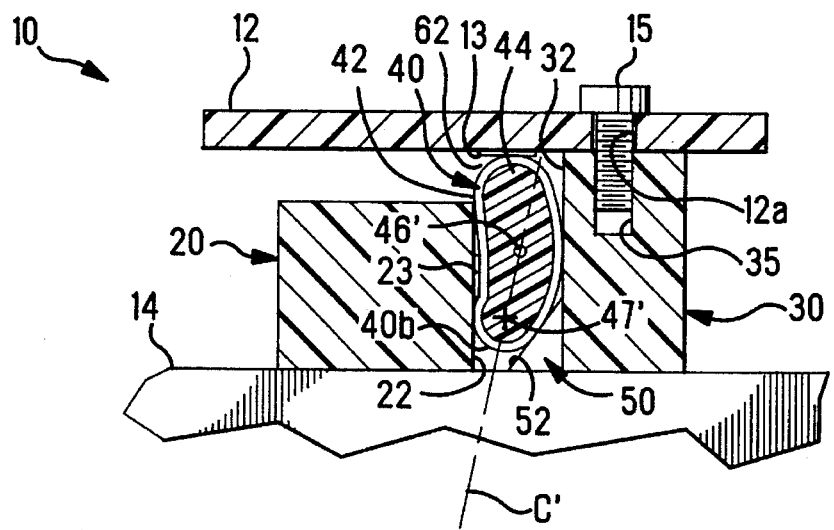
FIG. 3 shows the right angle connector of FIG. 1 in an assembled state.

FIG. 3 shows electrical connector 10 in a fully assembled state so that circuit trace 23 of electrical device 20 electrically connects flexible circuit 42 and circuit trace 13 of printed circuit board 12. As shown in FIG. 3, wedge 52 engages elastomeric electrical component 40 and biases the same towards circuit trace 23 of device 20, and to some extent biases elastomeric electrical component 40 up towards circuit trace 13 of printed circuit board 12. In this way, elastomeric electrical component 40 with flexible circuit 42 is snugly and resiliently disposed against circuit traces 13 and 23 thereby ensuring good electrical contact therebetween. As shown in FIG. 3, core center 46 of FIG. 2 has been translated to a location 46', further down towards surface 52 within chamber 62, by action of board 12 pressing on elastomeric member 40. The pressing action of board 12, therefore, both translates (or displaces) center 46 to 46', but also transforms (or deforms) the oval shape of elastomeric member 40 so that the entirety of member 40 moves within chamber 62. Line C' denotes a line intersecting core center 46' and a radius center 47', which line is now not generally parallel to a longitudinal depth axis of chamber 62, because the wedge component 50 is now pressing the electrical component 40 towards and against circuit trace 23.

Elastomeric electrical component 40 is adapted to provide conformance to non-planarities on the circuits 13 and 23, and generally comprises a small or miniature electrical component having an oval cross section with the flexible film circuit 42 wrapped around the elastomeric core 44. Elastomeric core 44 is formed of, for example, a silicone rubber composition having a suitable hardness and compression set. Flexible film circuit 42 comprises, for example, a polyimide material of a suitable thickness. The circuit traces on flexible circuit 42 are formed by, for example, continuous tracks of conductive material (e.g., gold-plated copper tracks) disposed on a film by conventional photo etching techniques. Center 46 of elastomeric electrical component 40 comprises, as stated above, a cord of fiber glass embedded in the elastomeric core 44. Wedge member 50 is preferably formed of a dielectric material, for example, a suitable plastic material. Additionally, circuit traces 13, 23, and 19, are formed of conductive material, for example, gold plated copper or gold plated beryllium.

Figure 4:
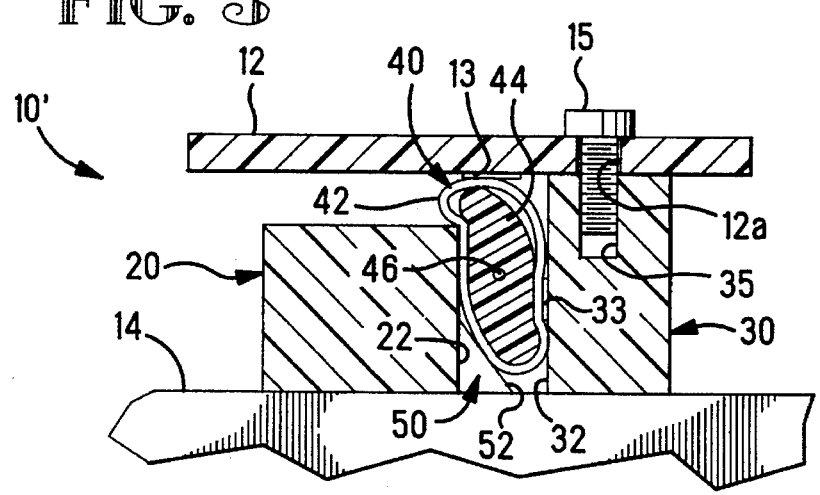
FIG. 4 shows a second embodiment of the right angle connector according to the present invention.

FIG. 4 shows an alternative embodiment of the electrical connector 10'. A circuit trace 33 is disposed on block 30 for engagement with flexible circuit 42 (which thereby transforms block 30 into an electrical component); additionally, wedge 50 is disposed on electrical device 20, thereby biasing elastomeric electrical component 40 towards and against circuit trace 33 of block 30 and circuit trace 13.

Figure 5:
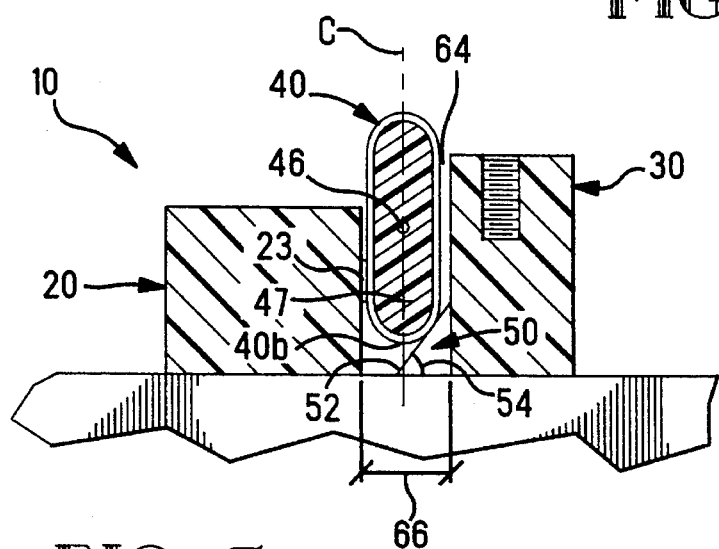
FIG. 5 shows a cross sectional view of a portion of the right angle connector of FIG. 1.

FIG. 5 shows the embodiment of FIG. 1 and the electrical connector 10 including gap 64, but further illustrates width 66, radius center 47 of arcuate edge 40b of elastomeric electrical component 40, and angle 54 of wedge wall 52 of wedge member 50. As described above, line C denotes a line intersecting core center 46 and radius center 47, which line is generally parallel to a longitudinal depth axis of chamber 62. In the preferred embodiment, circuit trace 23 of electrical device 20 is initially located between core center 46 and radius center 47 of elastomeric electrical component 40 when the same is in a pre-assembled position as shown in FIG. 2. At this point, gap 64 exists between elastomeric electrical component 40 and block 30 thereby allowing space for the deformation and shifting of elastomeric electrical component 40. Arcuate surface 40b of component 40 is resting on wedge wall 52 of wedge member 50 and is slightly deformed thereby. Angle 54 as shown in this preferred embodiment is generally a 60° angle and the cross section of the wedge member generally defines a 3-4-5 triangle. As the elastomeric component 40 is compressed by board 12 into, for example, its assembled state as shown in FIG. 3, component 40 will be forced to shift downwardly into chamber 62, thereby causing wiping action to occur between circuit trace 23 and flexible circuit 42. In other words, circuit trace 23 will appear to wipingly move relatively closer to core center 46 of elastomeric member 40. Wiping action also occurs between top arcuate side 40b and circuit trace 13 of board 12 as the top end of elastomeric component 40 is deformed in response to pressing engagement therewith.

Figure 6:
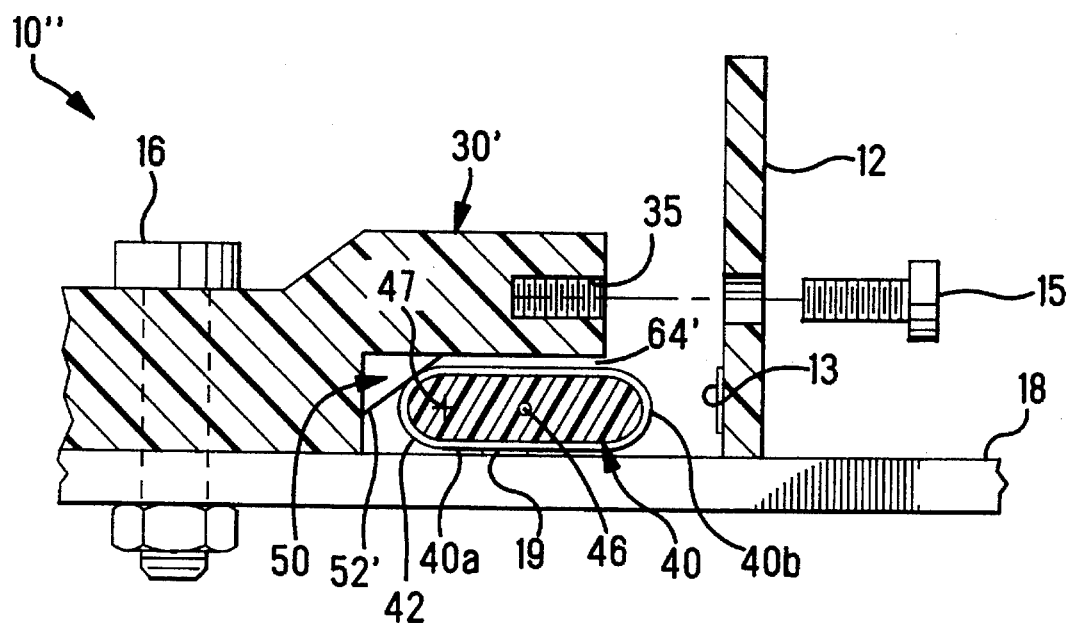
FIG. 6 shows a cross sectional view of a further embodiment of the right angle electrical connector according to the present invention.
Figure 7:
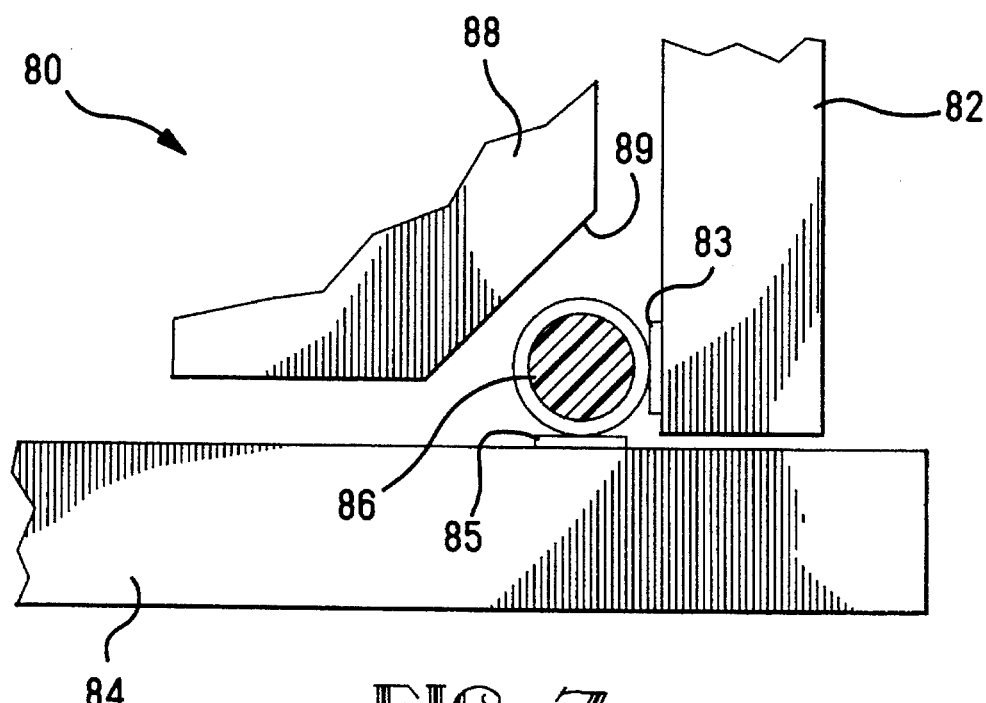
FIG. 7 shows a conventional right angle electrical connector as described above.

FIG. 6 shows an alternative embodiment 10" according to the present invention. Block 30' is shown with wedge member 52' defining a chamber wherein elastomeric electrical component 40 is disposed with a gap 64' between the component 40 and block 30'. Fastener 16 secures block 30' to motherboard 18 which has a circuit trace 19 thereon for engagement with flexible circuit 42. Board 12 has circuit trace 13 threreon for engagement with arcuate side 40b of component 40. When fully assembled, bolt 15 will be threaded into threaded hole 35 of block 30' so that circuit trace 13 presses against arcuate side 40b of component 40. In this way, component 40 will be compressed into and against surface 52' of wedge member 50'. Circuit trace 19 will be pressed and wiped by flexible circuit 42 as electrical component 40 is pressed by board 12, and trace 19 will be relatively closer to center 46 as center 46 is moved to the left as shown in FIG. 6, thereby ensuring good electrical contact therebetween.

In the preferred embodiment, the dimension of elastomeric electrical component 40 from the top to the bottom arcuate edges 40b will be about 0.350 inches and the width between straight sides 40a will be about 0.125 inches. However, it is contemplated that the distance between the arcuate sides 40b can be about 0.295 inches where the width between straight sides 40a is be 0.100 inches. The forgoing dimensions are merely for illustrating the preferred embodiments and are not intended to be construed as limiting the scope of the present invention.

Thus, while preferred embodiments of the invention have been disclosed, it is to be understood that the invention is not to be strictly limited to such embodiments but may be otherwise variously embodied and practiced within the scope of the appended claims. For example, although circuit traces 13 and 23 are shown as being generally perpendicular to each other, it is contemplated that either circuit trace can be at an angle more or less than 90° and yet still be brought into electrical engagement with flexible circuit 42. In other words, although the preferred embodiment comprises a right angle connector, it is contemplated that the present invention can be readily adapted to angled connectors comprising an angle of more or less than an acute angle.

Moreover, although electrical component 40 preferably and advantageously comprises an oval cross sectional shape, it is contemplated that the present invention can be practiced with electrical components of other cross sectional shapes. Additionally, although a threaded bolt 15 or 16 is shown as a fastening means in the drawing figures, it is contemplated that other means of connecting PC board 12 to block 30 or 30' can be utilized, for example, such other fastening members as clamps, locking fingers, or latches may be efficaciously employed as fastening means. Furthermore, although circuit device 20 is disclosed as an active electrical device, it is contemplated that device 20 can be a printed circuit board, LED device, a switch, or any other electrical circuit means.

Accordingly, what is claimed is:

1. An electrical connector for electrically interconnecting circuit traces on a printed circuit board and circuit traces on an electrical device, said electrical connector comprising:

a resilient electrical component with a flexible film circuit wrapped around a center thereof for electrical interconnection with said circuit traces;

a connector block member disposed adjacent to said electrical device;

first and second walls formed on said electrical device and said block member, respectively, said walls defining a chamber for receipt of said resilient electrical component; and a biasing member located within said chamber for biasingly engaging said resilient electrical component when said resilient electrical component is pressed into said chamber, whereby said resilient electrical component is translated and deformed within said chamber by the pressing action of said printed circuit board.

2. The electrical connector of claim 1, wherein said resilient electrical component comprises an arcuate edge having a radius with a center of said radius located within said resilient electrical component.

3. The electrical connector of claim 2, wherein said first wall includes a circuit trace thereon located adjacent to said resilient component center and said radius center.

4. The electrical connector of claim 2, wherein said first wall includes a circuit trace thereon located between said resilient component center and said radius center.

5. The electrical connector of claim 1, wherein said first wall includes a circuit trace thereon, and said resilient component center is moved relatively towards said first wall trace as said resilient component is pressed into said chamber.

6. The electrical connector of claim 1, wherein said resilient component comprises a generally oval shape.

7. The electrical connector of claim 1, wherein one of said first and second walls includes a circuit trace formed thereon on an opposing side of said chamber relative to said biasing member.

8. The electrical connector of claim 2, wherein said radius center is urged toward a circuit trace formed on one of said first and second walls as said resilient component is pressed into said chamber.

9. The electrical connector of claim 1, wherein said biasing member comprises a wall surface for engaging said resilient electrical component.

10. The electrical connector of claim 1, wherein said wall surface defines an acute angle with respect to an adjacent wall surface of said biasing member.

11. The electrical connector of claim 2, wherein said biasing member includes a lower edge which is generally aligned with said resilient component and said radius centers.

12. An electrical connector for electrically interconnecting circuit traces disposed on respective electrical component surfaces of electrical components, said electrical connector comprising:

a resilient electrical insert member with a flexible film circuit having circuit traces wrapped therearound for electrical interconnection with said electrical component circuit traces;

a connector block member disposed adjacent to said electrical components;

first and second walls formed on one of said electrical components and said block member, respectively, said walls defining a chamber for receipt of said resilient insert member; and a biasing member located within said chamber for biasingly engaging said resilient insert member and causing wiping action between said flexible film circuit traces and said electrical component circuit traces when said resilient insert member is pressed and translated as a whole within said chamber by one of said electrical components.

13. The electrical component of claim 12, wherein said insert member comprises an area therein which defines a first position of the center of a radius of an arcuate surface on said insert member.

14. The electrical connector of claim 12, wherein said biasing member is adapted to urge said radius center area from said first position to a second, offset position relative to said chamber as said insert member is translated within said chamber.

* * * * *